United States Patent
Noguchi et al.

(10) Patent No.: US 10,624,204 B2
(45) Date of Patent: Apr. 14, 2020

(54) OPTICAL MODULE AND OPTICAL TRANSMISSION EQUIPMENT

(71) Applicant: Lumentum Japan, Inc., Kanagawa (JP)

(72) Inventors: Daisuke Noguchi, Kanagawa (JP); Hiroshi Yamamoto, Tokyo (JP)

(73) Assignee: Lumentum Japan, Inc., Kanagawa (JP)

( * ) Notice: Subject to any disclaimer, the term of this patent is extended or adjusted under 35 U.S.C. 154(b) by 0 days.

(21) Appl. No.: 16/111,281

(22) Filed: Aug. 24, 2018

(65) Prior Publication Data

US 2019/0069395 A1 Feb. 28, 2019

(30) Foreign Application Priority Data

Aug. 31, 2017 (JP) .................... 2017-167122

(51) Int. Cl.
*H05K 1/02* (2006.01)
*H01R 12/58* (2011.01)
(Continued)

(52) U.S. Cl.
CPC .......... *H05K 1/0253* (2013.01); *H01R 12/58* (2013.01); *H01R 12/62* (2013.01); *H01R 12/65* (2013.01); *H05K 1/024* (2013.01); *H05K 1/113* (2013.01); *H01S 5/02212* (2013.01); *H01S 5/02276* (2013.01); *H01S 5/02476* (2013.01); *H05K 1/028* (2013.01); *H05K 1/184* (2013.01);
(Continued)

(58) Field of Classification Search
CPC ...... H05K 1/0253; H05K 1/024; H05K 1/113; H05K 1/028; H05K 1/184; H05K 2201/093; H05K 2201/10121; H05K 2201/10151; H05K 2201/10174; H05K 2201/10287; H01R 12/58; H01R 12/62; H01R 12/65; H01S 5/02212; H01S 5/02276; H01S 5/02476
See application file for complete search history.

(56) References Cited

U.S. PATENT DOCUMENTS 9,900,991 B2 * 2/2018 Kang .................... H05K 1/189
2005/0175312 A1 8/2005 Tanaka et al.
(Continued)

FOREIGN PATENT DOCUMENTS

JP 3990674 B2 10/2007
JP 2017-005159 A 1/2017

*Primary Examiner* — Pete T Lee
(74) *Attorney, Agent, or Firm* — Harrity & Harrity, LLP (57) ABSTRACT

An optical module includes a conductor plate including a first through hole, a signal lead terminal fixed to the first through hole, and a wiring circuit board. The wiring circuit board includes a signal strip conductor member and a land on a first surface and a ground conductor layer and a second through hole on a second surface, the land surrounds the second through hole and is in contact with the signal strip conductor member, the signal lead terminal and the land are physically connected to each other through a solder and thus the signal lead terminal and the signal strip conductor member are electrically connected to each other, and at least a part of the land spreads outwardly, in a plan view, from not only a portion in contact with the signal strip conductor member but also an outer edge of the first through hole.

20 Claims, 10 Drawing Sheets

(51) Int. Cl.
  *H05K 1/11* (2006.01)
  *H01R 12/62* (2011.01)
  *H01R 12/65* (2011.01)
  H05K 1/18 (2006.01)
  H01S 5/022 (2006.01)
  H01S 5/024 (2006.01)

(52) U.S. Cl.
  CPC ............... *H05K 2201/093* (2013.01); *H05K 2201/10121* (2013.01); *H05K 2201/10151* (2013.01); *H05K 2201/10174* (2013.01); *H05K 2201/10287* (2013.01)

(56) References Cited

U.S. PATENT DOCUMENTS

2008/0203510 A1* 8/2008 Kawamura ......... H01L 31/0203
   257/433
2009/0135864 A1* 5/2009 Aruga ................. H05K 1/0243
   372/29.02
2016/0365700 A1  12/2016 Noguchi et al.

\* cited by examiner

OPTICAL MODULE AND OPTICAL TRANSMISSION EQUIPMENT

CROSS-REFERENCE TO RELATED APPLICATION

The present application claims priority from Japanese application JP2017-167122 filed on Aug. 31, 2017, the content of which is hereby incorporated by reference into this application.

BACKGROUND OF THE INVENTION

1. Field of the Invention

The present invention relates to an optical module and an optical transmission equipment, and particularly to a technique for preventing mismatching of characteristic impedance.

2. Description of the Related Art

An optical subassembly (OSA) including an optical semiconductor device is used. In recent years, demands for not only high speed but also low price have been increased in optical modules including one or a plurality of optical subassemblies.

The optical subassembly generally includes a stem that is electrically grounded (GND) and lead terminals that penetrate the stem and are electrically insulated from the stem. In addition, the stem and a cap attached to the stem constitute a housing that accommodates the optical semiconductor device. The lead terminals and the stem constitute a coaxial line. One ends of the lead terminals are connected to the optical semiconductor device through a wiring circuit board or the like as necessary. The other ends of the lead terminals are connected to an IC or the like, from and to which modulated electric signals are output and input, through a wiring circuit board such as a flexible printed circuit (FPC). Signal lines are formed on one-side surface of the flexible printed circuit, and a ground conductor layer (GND) is formed on the other-side surface thereof. The modulated electric signals are transmitted through transmission lines including the flexible printed circuit, the lead terminals, and the like.

As a communication speed increases, a frequency included in the modulated electric signal reaches a high frequency. Therefore, as the frequency of the electric signal reaches a high frequency, reflection of the electric signal is likely to occur at a mismatching point of characteristic impedance in the transmission line. Mismatching of characteristic impedance easily occurs between, for example, the coaxial line formed by the lead terminal and the stem and the wiring circuit board such as an FPC. At the mismatching point of characteristic impedance, the reflected wave of the electric signal becomes apparent in the transmission line and interferes with the original modulated electric signal, resulting in deterioration of the waveform quality of the optical signal in optical transmission, for example. Therefore, a technique according to the related art is disclosed in which the influence on the optical waveform is suppressed at a connection point between the lead terminal and the FPC, in which the mismatching of characteristic impedance tends to occur.

JP 2017-005159 A discloses a technique for reducing the inductance parasitic on the lead terminal by covering the periphery of the lead terminal, which is normally an air layer, with a dielectric. Japanese Patent No. 3990674 discloses a technique for canceling the inductance parasitic on the lead terminal by adding the capacitance to the through hole of the flexible printed circuit, thereby adjusting the characteristic impedance.

SUMMARY OF THE INVENTION

However, according to the technique disclosed in JP 2017-005159 A, when the coating amount of dielectric material is not an appropriate amount, a void may be formed around the lead terminal, and characteristic impedance may be increased beyond a desired value. According to the technique disclosed in Japanese Patent No. 3990674, the capacitance is adjusted, and thus it is possible to compensate the inductance parasitic around the lead terminal, and to average the impedance by such a capacitance. In a recent optical subassembly, the demand for higher speed has been increased as described above. However, as disclosed in Japanese Patent No. 3990674, although the impedance in the low frequency band is averaged by allowing the inductance and providing the capacitance corresponding thereto, the influence of the capacitance and the inductance becomes remarkable in the high frequency band, the averaging of the impedance becomes difficult, and enormous mismatching of characteristic impedance may be caused. For this reason, the reduction in both the inductance and the capacitance is necessary with the higher speed, but it is very difficult with the technique disclosed in Japanese Patent No. 3990674.

In general, a lead terminal is inserted into a through hole connected to a signal line on a flexible printed circuit, and the signal line and the lead terminal are electrically connected to each other by soldering. Generally, the lead terminal is manually inserted into the through hole of the flexible printed circuit. In a bonding operation by soldering, an air layer may be generated in a region where the lead terminal is not covered with a conductor or the dielectric, and moreover, manufacturing variations occur due to variations in the volume of the air layer, and the inductance parasitic on the lead terminal may further increase.

The present invention has been made in view of the above problems, and an object thereof is to provide an optical module and an optical transmission equipment in which both robustness and cost reduction are achieved with regard to suppression of characteristic impedance mismatching.

(1) In order to solve the above problems, an optical module according to the present invention includes: a conductor plate including a first through hole that penetrates from an inner surface to an outer surface; a signal lead terminal that penetrates the first through hole from the inner surface to the outer surface and protrudes from the outer surface, the signal lead terminal being fixed to the first through hole by a dielectric; and a wiring circuit board that includes a first surface and a second surface and is provided with a signal strip conductor member and a land disposed respectively on the first surface, a ground conductor layer disposed on the second surface, and a second through hole through which the signal lead terminal penetrates and is electrically connected to the signal strip conductor member, wherein the land surrounds the second through hole and is in contact with the signal strip conductor member, the second surface of the wiring circuit board faces the outer surface of the conductor plate, and the wiring circuit board is disposed with respect to the conductor plate such that the signal lead terminal penetrates the second through hole from the second surface to the first surface and protrudes from the first surface, the signal lead terminal and the land are physically connected to each other through a solder, and thus the signal lead terminal and the signal strip conductor member are electrically connected to each other, and at least a part of the land spreads outwardly, in a plan view, from not only a portion in contact with the signal strip conductor member but also an outer edge of the first through hole.

(2) In the optical module according to (1), at least a part between the signal lead terminal and the second through hole may have a region which becomes an outside air environment.

(3) In the optical module according to (1) or (2), the optical module may further include a first protective layer that is disposed on the first surface and covers the signal strip conductor member and at least a part of the outer edge of the land.

(4) In the optical module according to any one of (1) to (3), the first protective layer may be disposed out of the land so as to avoid a region, where the solder is disposed in order to physically connect with the signal lead terminal.

(5) In the optical module according to any one of (1) to (4), the optical module may further include a second protective layer that is disposed on the second surface, covers the ground conductor layer, and is disposed so as to avoid a region where the wiring circuit board and the conductor plate overlap with each other in a plan view.

(6) In the optical module according to any one of (1) to (5), a dielectric may be disposed in at least a part between the signal lead terminal and the second through hole.

(7) In the optical module according to (6), the dielectric may be a material having flexibility higher than that of the second protective layer when the wiring circuit board is disposed with respect to the conductor plate.

(8) In the optical module according to any one of (1) to (7), the signal lead terminal and the signal strip conductor member may be electrically connected to each other only by physical connection between the signal lead terminal and the land through the solder.

(9) In the optical module according to any one of (1) to (8), a land pattern electrically connected to the land may not be formed on the second surface of the wiring circuit board.

(10) In the optical module according to any one of (1) to (9), a conductor member electrically connected to the land may not be formed on an inner wall of the second through hole of the wiring circuit board.

(11) In the optical module according to any one of (1) to (10), the conductor plate may have a maximum width of 6 mm or less, the signal lead terminal may have a maximum width of 0.22 mm or more and 0.35 mm or less, the first through hole may have a maximum width of 0.4 mm or more and 0.85 mm or less, and the land may have a maximum width of 0.9 mm or more in a portion other than a connection portion with the signal strip conductor member.

(12) An optical transmission equipment according to the present invention may be an optical transmission equipment on which the optical module according to any one of (1) to (11) is mounted.

According to the present invention, it is possible to provide an optical module and an optical transmission equipment in which both robustness and cost reduction are achieved with regard to suppression of characteristic impedance mismatching.

DETAILED DESCRIPTION OF THE INVENTION

Hereinafter, embodiments of the present invention will be described specifically and in detail with reference to the drawings. In all the drawings for describing the embodiments, the same reference numerals are given to the members having the same function, and the repeated description thereof will be omitted. The drawings illustrated below merely illustrate examples of the embodiments, and the sizes of the drawings and the scales described in the embodiments do not necessarily coincide with each other.

First Embodiment

Figure 1:
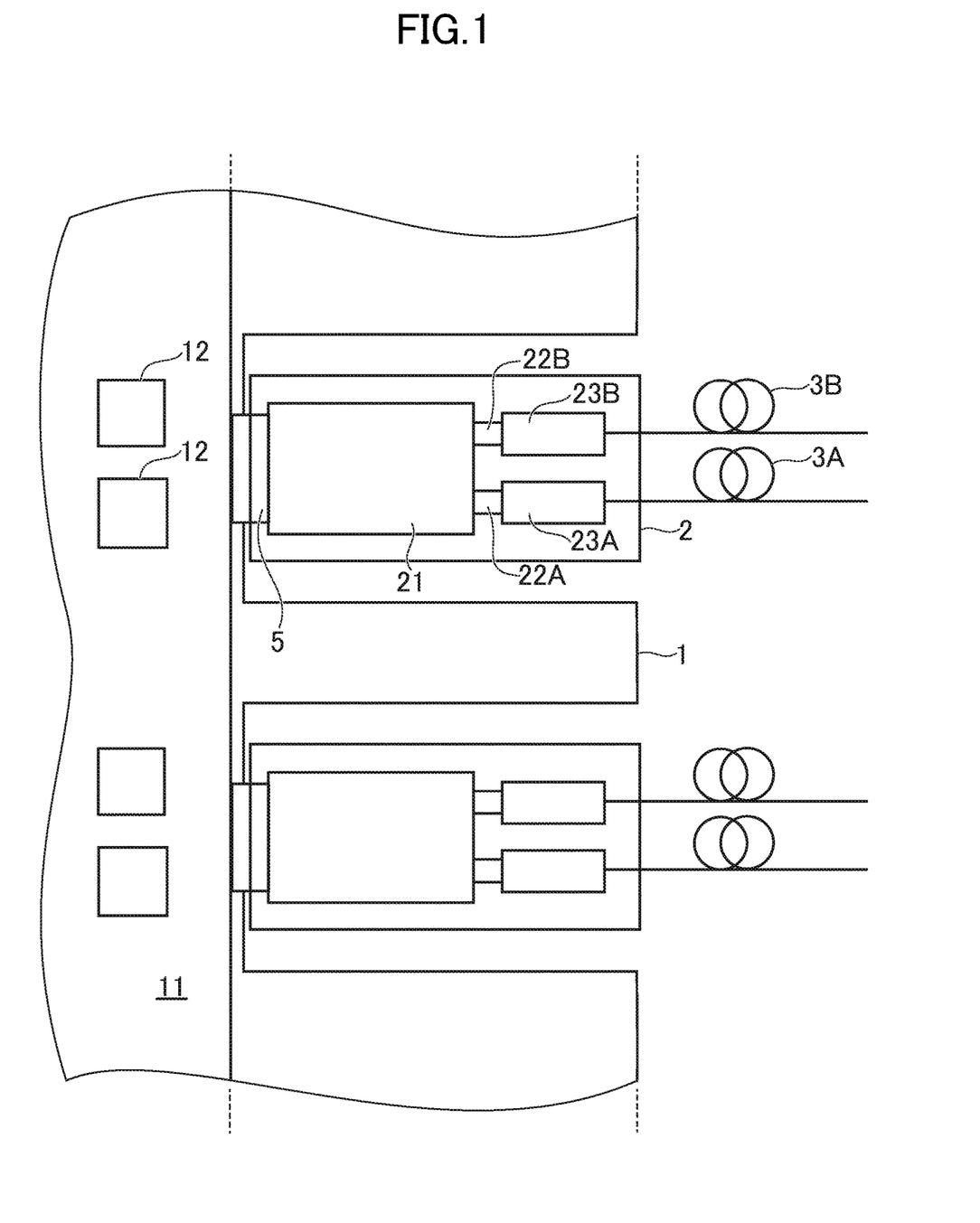
FIG. 1 is a schematic view illustrating a configuration of an optical transmission equipment and an optical module according to a first embodiment of the present invention.

FIG. 1 is a schematic view illustrating a configuration of an optical transmission equipment 1 and an optical module 2 according to a first embodiment. The optical transmission equipment 1 includes a printed circuit board 11 (PCB) and an IC 12. The optical transmission equipment 1 is, for example, a large-capacity router or a switch. The optical transmission equipment 1 has, for example, a function of a switching equipment, and is disposed in a base station or the like. A plurality of optical modules 2 are mounted in the optical transmission equipment 1. The optical transmission equipment 1 acquires data for receiving (electric signal for receiving) from the optical module 2, determines to transmit what data to where using the IC 12 or the like, generates data for transmitting (electric signal for transmitting), and transmits the data to the corresponding optical module 2 through the printed circuit board 11.

The optical module 2 is a transceiver having a function of optical transmitting and a function of optical receiving. The optical module 2 includes a printed circuit board 21, an optical receiver module 23A which converts an optical signal received through an optical fiber 3A into an electric signal, and an optical transmitter module 23B which converts an electric signal to an optical signal and transmits the optical signal to an optical fiber 3B. The printed circuit board 21 is connected to the optical receiver module 23A and the optical transmitter module 23B through flexible printed circuits 22A and 22B (FPC), respectively. An electric signal is transmitted from the optical receiver module 23A to the printed circuit board 21 through the flexible printed circuit 22A, and an electric signal is transmitted from the printed circuit board 21 to the optical transmitter module 23B through the flexible printed circuit 22B. The optical module 2 and the optical transmission equipment 1 are connected to each other through an electrical connector 5. The optical receiver module 23A and the optical transmitter module 23B are electrically connected to the printed circuit board 21 and convert an optical/electric signal into an electric/optical signal.

A transmission system according to the first embodiment includes two or more of the optical transmission equipments 1, two or more of the optical modules 2, and one or more of optical fibers 3 (not shown in FIG. 1: for example, the optical fibers 3A and 3B). One or more of the optical modules 2 are connected to each optical transmission equipment 1. The optical fiber 3 is connected between the optical modules 2 mounted on the two optical transmission equipments 1, respectively. Transmitting data generated by one of the optical transmission equipment 1 is converted into an optical signal by the mounted optical module 2, and such an optical signal is transmitted to the optical fiber 3. The optical signal transmitted over the optical fiber 3 is received by the optical module 2 mounted on the other of the optical transmission equipment 1, and the optical module 2 converts the optical signal into an electric signal and transmits the electric signal to the other of the optical transmission equipment 1 as receiving data.

Figure 2:
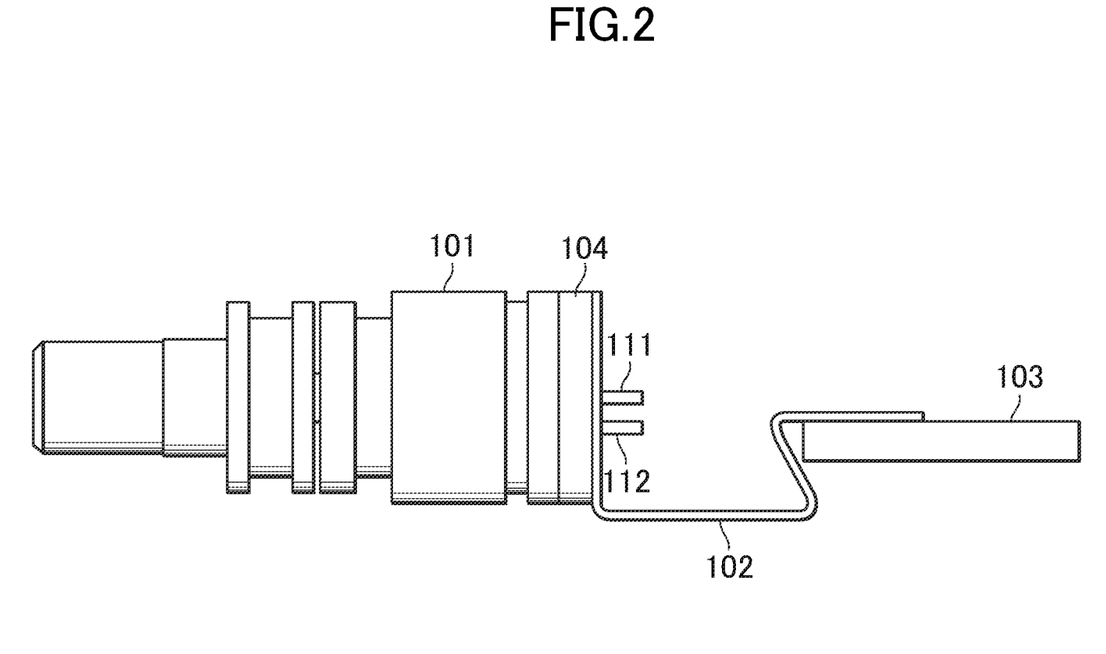
FIG. 2 is a side view of an optical subassembly according to the first embodiment of the present invention.

FIG. 2 is a side view of a main part of the optical module 2 according to the first embodiment. The optical transmitter module 23B provided in the optical module 2 includes one or a plurality of optical subassemblies 101. Each optical subassembly 101 includes one or a plurality of optical semiconductor devices. The optical transmitter module 23B according to the first embodiment includes one of the optical subassembly for transmitting an optical signal of 25 Gbit/s. The optical subassembly 101 according to the first embodiment is a TO-CAN package type TOSA (Transmitter Optical Subassembly) including one of the optical semiconductor device. The flexible printed circuit 102 is connected to the optical subassembly 101, and the flexible printed circuit 102 is also connected to a printed circuit board 103. Here, the flexible printed circuit 102 is apart or the whole of the flexible printed circuit 22B, and the printed circuit board 103 is a part or the whole of the printed circuit board 21. From a driver Ic (not illustrated) mounted in the printed circuit board 103, a modulated electric signal is transmitted to the optical subassembly 101 through the flexible printed circuit 102, which is connected to the printed circuit board 103 by soldering or the like. The optical subassembly 101 according to the first embodiment includes a stem 104, a pair of signal lead terminals 111, and a ground lead terminal 112 on the side connected to the flexible printed circuit 102.

Figure 3:
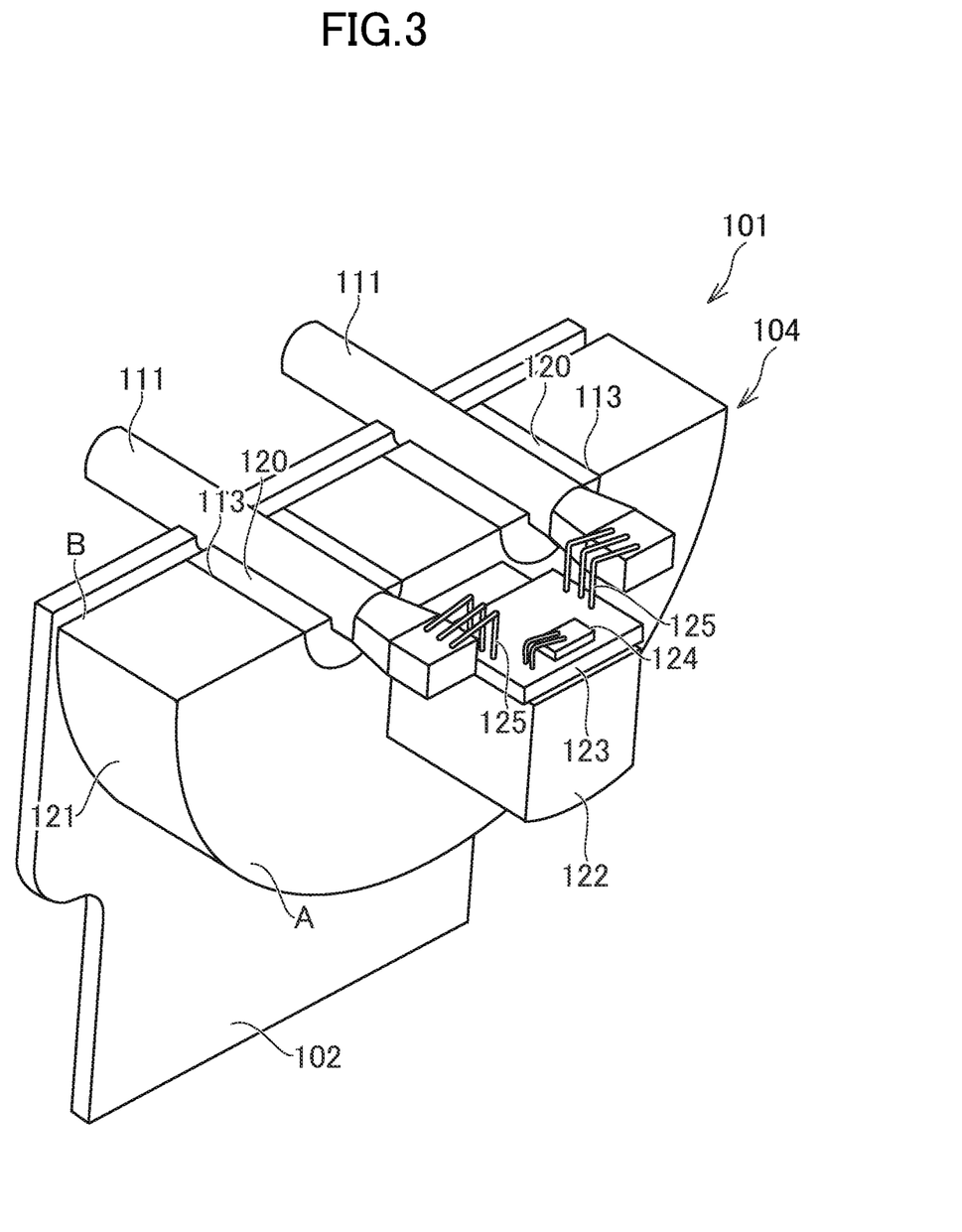
FIG. 3 is a diagram illustrating a structure of the optical subassembly according to the first embodiment of the present invention.

FIG. 3 is a diagram illustrating a structure of the optical subassembly 101 according to the first embodiment. The stem 104 includes an inner surface A illustrated in FIG. 3 and an outer surface B not illustrated in FIG. 3. The stem 104 is a conductor plate including a pair of first through holes (coaxial feedthroughs) 113 penetrating from the inner surface A to the outer surface B. When the optical subassembly 101 is driven, the stem 104 is maintained at a ground potential (GND). As illustrated in FIG. 3, each of the pair of signal lead terminals 111 penetrates the corresponding first through hole 113 from the inner surface A to the outer surface B and protrudes from the outer surface B. In addition, a space between each of the pair of signal lead terminals 111 and an inner wall of the corresponding first through hole 113 is filled with a dielectric 120 (for example, glass), and each of the pair of signal lead terminals 111 is fixed to the corresponding first through hole 113 by the dielectric 120. Further, the ground terminal 112 (not illustrated) is a ground lead terminal (case pin) which is brazed to the outer surface of the stem 104.

Further, the stem 104 includes an eyelet 121 (metal disc) serving as a main body, a pedestal part 122, a ceramic substrate 123 disposed on an upper surface of the pedestal part 122, an optical semiconductor device 124 (here, a semiconductor laser element) mounted on the ceramic substrate 123, and a plurality of bonding wires 125. The pedestal part 122 is disposed to protrude in a vertical direction from the inner surface A in the main body (eyelet 121) of the stem 104. The ceramic substrate 123 is made of aluminum nitride or the like having a thermal expansion coefficient close to that of the optical semiconductor device 124, and the ceramic substrate 123 is die-bonded to the upper surface of the pedestal part 122. A metallization pattern is formed on a front and back surfaces of the ceramic substrate 123. The ceramic substrate 123 is electrically connected to the main body (eyelet 121) of the stem 104 serving as a ground conductor member by the metallization pattern formed on the back surface. A transmission line is constituted by the metallization pattern formed on the front surface of the ceramic substrate 123 on which the optical semiconductor device 124 is mounted, and the metallization pattern and the optical semiconductor device 124 mounted on the front surface are electrically connected to each other. The pair of signal lead terminals 111 and the ceramic substrate 123 are electrically connected to each other by the plurality of bonding wires 125.

Figure 4A:
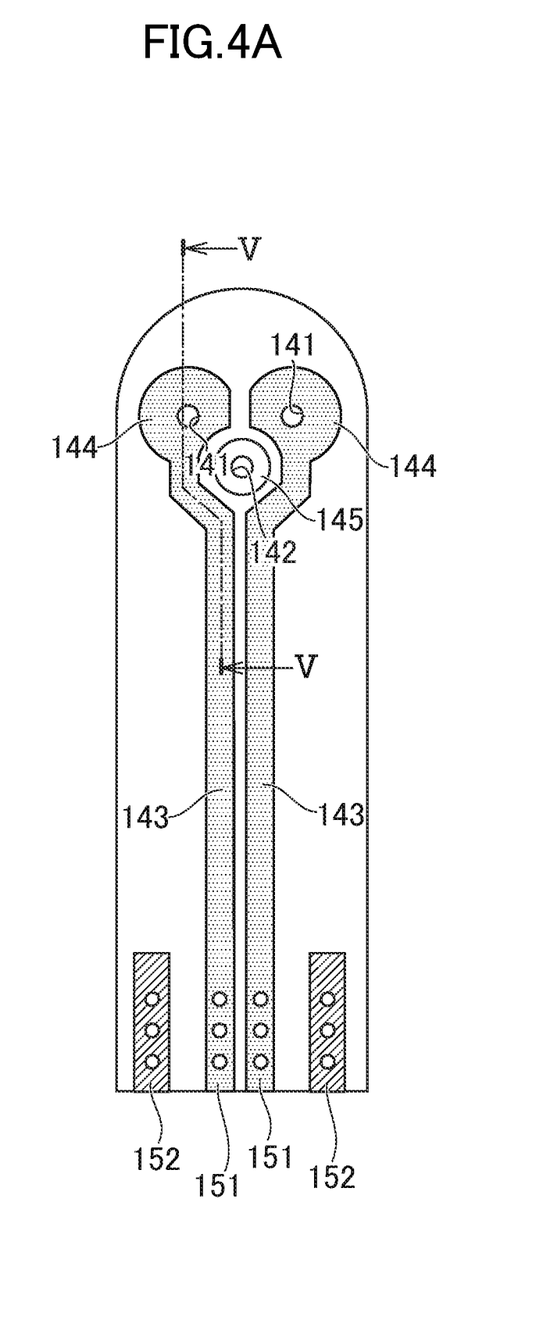
FIG. 4A is a plan view of a flexible printed circuit according to the first embodiment of the present invention.
Figure 4B:
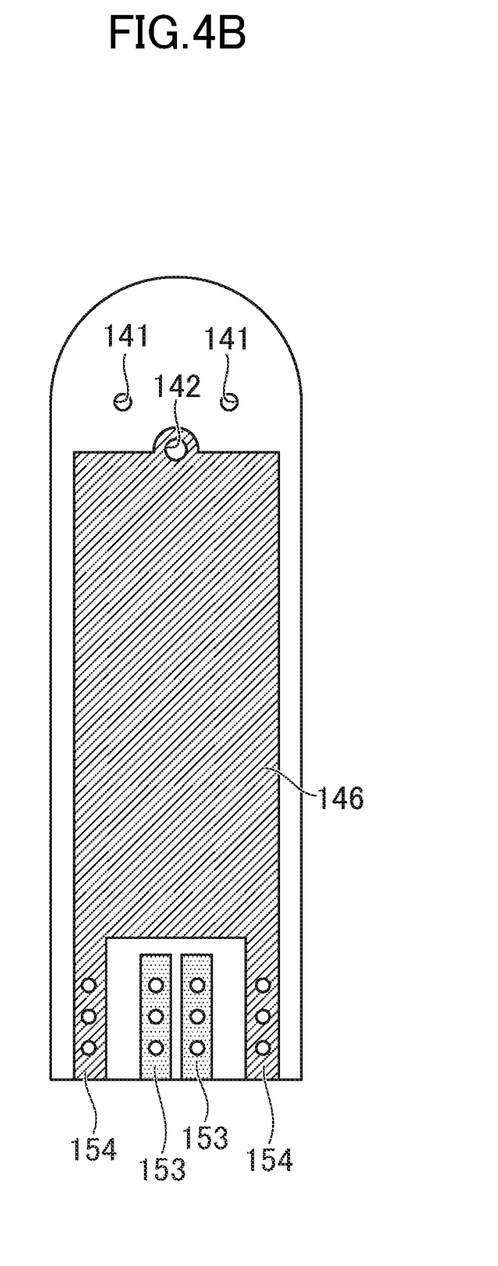
FIG. 4B is a bottom view of the flexible printed circuit according to the first embodiment of the present invention.

FIG. 4A is a plan view of the flexible printed circuit 102 according to the first embodiment, and FIG. 4B is a bottom view of the flexible printed circuit 102 according to the first embodiment. The flexible printed circuit 102 is a wiring circuit board including a first surface (front surface) and a second surface (back surface), and a main body of the flexible printed circuit 102 is a substrate 160 (not illustrated) made of a dielectric. FIG. 4A illustrates the first surface of the flexible printed circuit 102, and FIG. 4B illustrates the second surface of the flexible printed circuit 102. Although a first protective layer 150A and a second protective layer 150B are formed on the first surface and the second surface of the flexible printed circuit 102, respectively, the description will not be herein presented so as to facilitate understanding of the structure.

As illustrated in FIGS. 4A and 4B, the flexible printed circuit 102 includes a pair of second through holes 141, a ground through hole 142, a pair of signal strip conductor members 143 and a pair of signal lands 144 disposed respectively on the first surface, a ground land 145 disposed on the first surface, and a ground conductor layer 146 disposed on the second surface. In order to connect (fix) the flexible printed circuit 102 to the stem 104, the second surface (back surface) of the flexible printed circuit 102 faces the outer surface B of the stem 104, and the flexible printed circuit 102 is disposed with respect to the stem 104 so that the pair of signal lead terminals 111 penetrate the pair of second through holes 141 from the second surface to the first surface and protrude from the first surface. Similarly, the ground terminal 112 penetrates the ground through hole 142 from the second surface to the first surface and protrudes from the first surface.

As illustrated in FIG. 4A, the pair of signal lands 144 and the ground land 145 are disposed on the first surface corresponding to the pair of second through holes 141 and the ground through hole 142. Each of the pair of signal lands 144 surrounds the corresponding second through hole 141 and contacts with one end of the corresponding signal strip conductor member 143. The ground land 145 surrounds the ground through hole 142 and is spaced apart from the pair of signal lands 144 and the pair of signal strip conductor members 143. Each of the pair of signal strip conductor members 143 extends from the corresponding signal land 144, bends so as to be spaced from the adjacent ground land 145, and extends along an extending direction of the flexible printed circuit 102. The other ends of the pair of signal strip conductor members 143 are connected to a pair of first signal terminals 151, respectively. Main parts of the pair of signal strip conductor members 143 extend along the extending direction of the flexible printed circuit 102 with a certain width while being spaced from each other at a fixed interval. A pair of first ground terminals 152 are disposed on both sides of the pair of first signal terminals 151. The signal strip conductor member 143 and the signal land 144 are formed integrally with each other. A boundary between the signal strip conductor member 143 and the signal land 144 is defined as an end of a portion of the signal strip conductor member 143 extending at a certain width.

As illustrated in FIG. 4B, the ground conductor layer 146 is disposed on the second surface of the flexible printed circuit 102. The ground conductor layer 146 surrounds the ground through hole 142 and is formed by spreading the second surface. The second surface of the flexible printed circuit 102 is not disposed with lands which respectively surround the pair of second through holes 141. The ground conductor layer 146 is not formed on an upper half of a place connected to the stem 104, and is also spaced from the pair of second through holes 141. A pair of second signal terminals 153 are disposed on the other end (the side opposite to the side connected to the stem 104) of the flexible printed circuit 102 so as to overlap with the pair of first signal terminals 151 in a plan view. The ground conductor layer 146 is spaced from each of the pair of second signal terminals 153 and is connected to a pair of second ground terminals 154 disposed on both sides. The pair of second ground terminals 154 are disposed so as to overlap with the pair of first ground terminals 152 in a plan view. A microstrip line serving as a differential transmission line is configured including the pair of signal strip conductor members 143 and the ground conductor layer 146. Each of the pair of first signal terminals 151 is electrically connected to the corresponding second signal terminal 153 via a plurality of through holes in which conductor members are formed on the inner wall. Similarly, each of the pair of first ground terminals 152 is electrically connected to the corresponding second ground terminal 154 via a plurality of through holes in which conductor members are formed on the inner wall.

Figure 5:
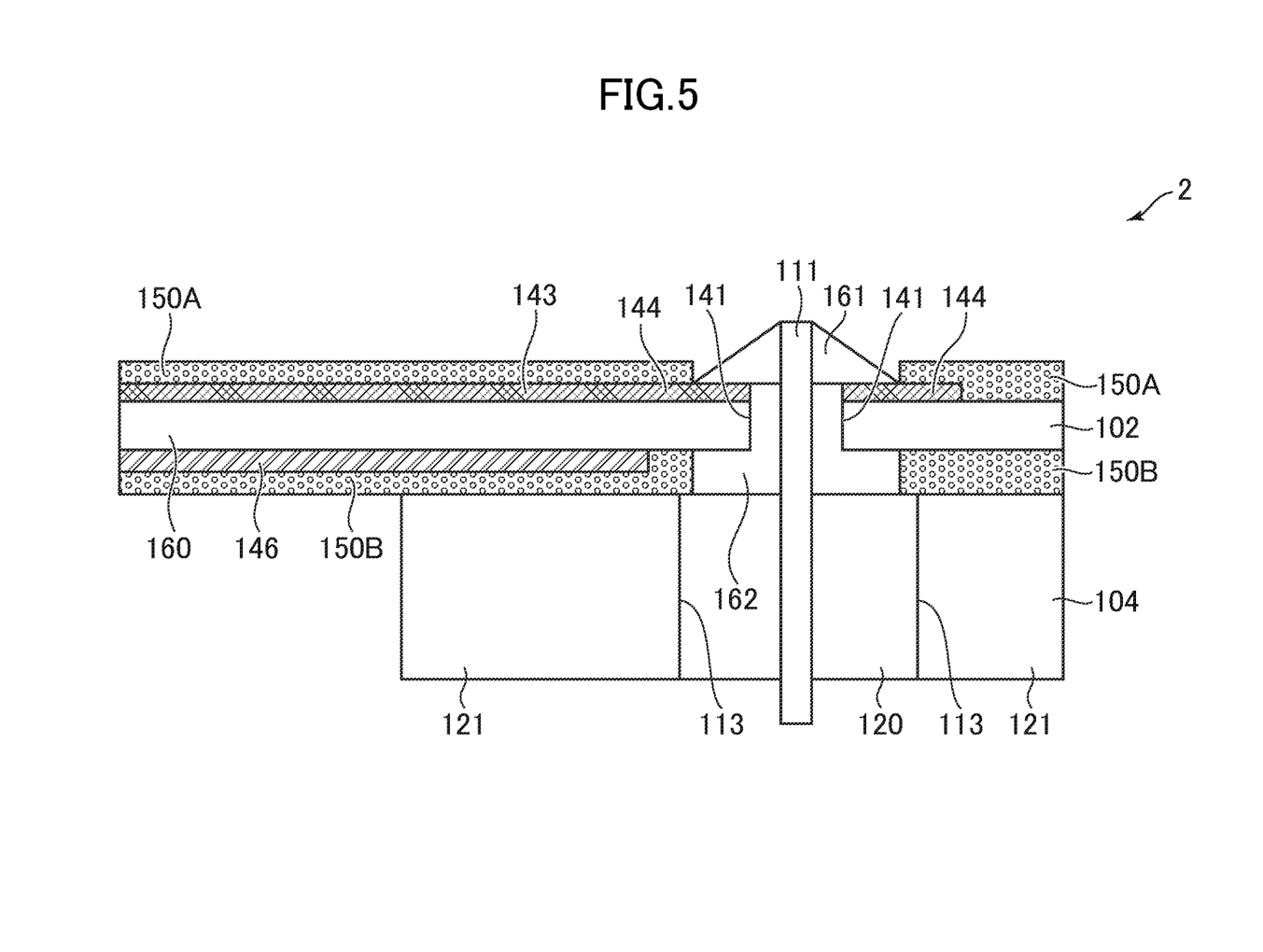
FIG. 5 is a cross-sectional view illustrating a structure of a part of the optical module according to the first embodiment of the present invention.

FIG. 5 is a cross-sectional view illustrating a structure of apart of the optical module 2 according to the first embodiment, and illustrates structures of the flexible printed circuit 102 and the stem 104. FIG. 5 illustrates a cross section taken along line V-V illustrated in FIG. 4A. As illustrated in FIG. 5, the flexible printed circuit 102 is configured such that the pair of signal strip conductor members 143 and the pair of signal lands 144 are disposed on the first surface of the substrate 160 made of the dielectric and the ground conductor layer 146 is disposed on the second surface of the substrate 160. The signal lead terminal 111 penetrates the second through hole 141 from the second surface to the first surface and protrudes from the first surface. The signal land 144 surrounds the second through hole 141. The signal lead terminal 111 and the signal land 144 are physically connected to each other through solder 161. Thus, the signal lead terminal 111 and the signal strip conductor member 143 are electrically connected to each other. An air layer 162 (void) exists between the signal lead terminal 111 and the second through hole 141. A conductor member electrically connected to the signal land 144 is not formed on the inner wall of the second through hole 141, and a land pattern electrically connected to the signal land 144 is not formed on the second surface (back surface) of the flexible printed circuit 102. That is, the second through hole 141 is a so-called non-through hole. The signal lead terminal 111 and the signal strip conductor member 143 are electrically connected to each other only by the physical connection between the signal lead terminal 111 and the signal land 144 through the solder 161.

The solder 161 connects (physically and electrically) the signal lead terminal 111 and the signal land 144 on the first surface of the substrate 160. Since no conductor member is formed on the inner wall of the second through hole 141 and no signal land is formed on the second surface of the substrate 160, the solder 161 can be prevented from wrapping around the second surface side of the substrate 160. Thus, this causes the effect of reducing the possibility (potential) that the signal lead terminal 111 is electrically connected to the ground conductor layer 146 disposed on the second surface of the substrate 160 to cause short-circuiting. On the other hand, since the solder 161 physically connects the signal lead terminal 111 and the signal land 144 only on the first surface of the substrate 160, the reliability of the physical connection is lowered. In addition, at least part of the space between the signal lead terminal 111 and the second through hole 141 is a region that becomes an outside air environment. Here, the air layer 162 exists between the signal lead terminal 111 and the second through hole 141. This leads to an increase in inductance. The outside air environment is not limited to air, and may be another gas (for example, nitrogen gas).

The main feature of the optical subassembly 101 according to the first embodiment is that, in a plan view, a portion in contact with the signal strip conductor member 143 and at least a part of the signal land 144 spreads outwardly from the outer edge of the first through hole 113. Here, the signal land 144 has a circular shape, and has an outer diameter larger than an inner diameter of the first through hole 113. That is, the signal land 144 spreads outwardly from the entire outer edge of the first through hole 113 in a plan view. Since the signal land 144 has a wide region, the physical connection between the signal lead terminal 111 and the signal land 144 can be made stronger through the solder 161, and the capacitance can be increased. As the capacitance increases, the increase in inductance due to the air layer 162 can be compensated.

Herein, the optical subassembly 101 is the TO-CAN package type optical transmitter, and characteristic impedance of the transmission line is matched to be 25Ω. Generally, the dielectric 120 is realized by a material such as glass, and has a dielectric constant of 6 to 7. Openings (inner diameters) of the pair of first through holes 113 are 0.7 mm, respectively, outer diameters of the pair of signal lead terminals 111 are 0.25 mm, respectively. Thus, the characteristic impedance of a coaxial line in the stem 104 can be matched to be near 25Ω. In contrast, outer diameters of the pair of signal lands 144 in the flexible printed circuit 102 are 1 mm, respectively, and are larger than the inner diameters of the pair of first through holes 113, respectively.

The maximum width of the eyelet 121 (metal disc) of the stem 104 is preferably 6 mm or less. The maximum width of the signal lead terminal 111 is preferably 0.22 mm or more and 0.35 mm or less. The maximum width of the first through hole 113 is preferably 0.4 mm or more and 0.85 mm or less. The maximum width of the signal land 144 is preferably 0.9 mm or more in a portion other than the connection portion with the signal strip conductor member 143. When the eyelet 121 has a circular shape or a substantially circular shape, the maximum width of the eyelet 121 is an outer diameter. When the cross section of the signal lead terminal 111 has a circular shape, the maximum width of the signal lead terminal 111 is an outer diameter. When the cross section of the first through hole 113 has a circular shape, the maximum width of the first through hole 113 is an inner diameter. When the signal land 144 has a circular shape, the maximum width of the signal land 144 is an outer diameter.

Figure 6:
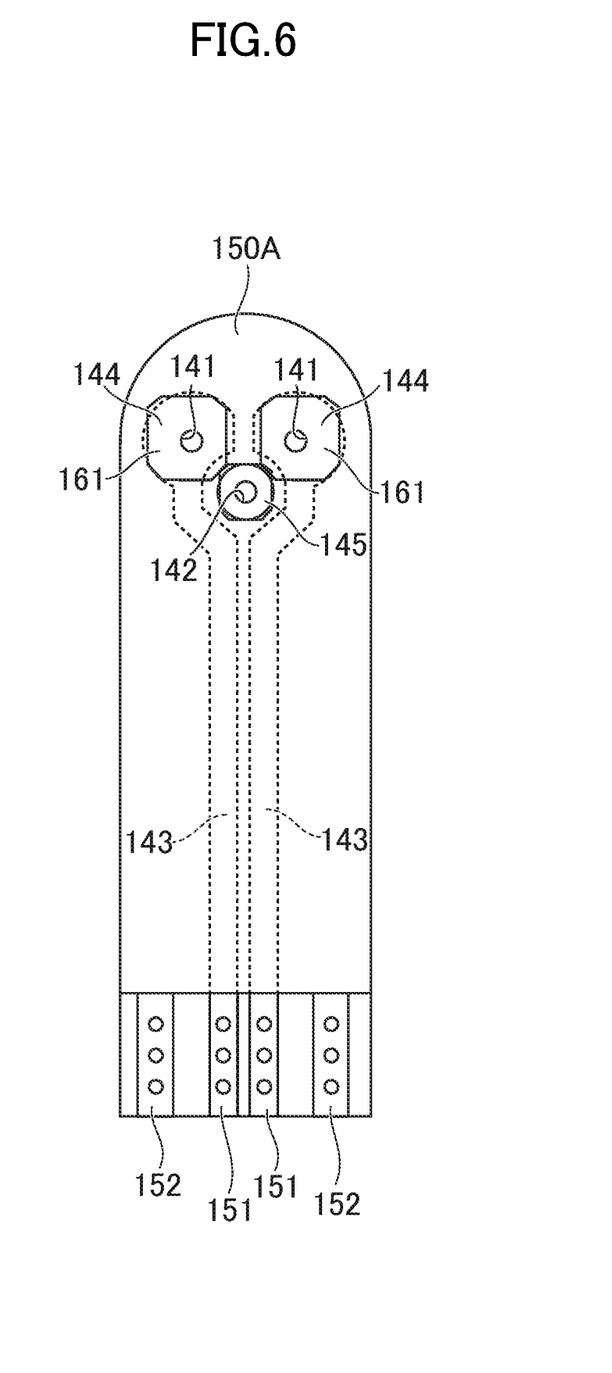
FIG. 6 is a plan view of the flexible printed circuit according to the first embodiment of the present invention.

FIG. 6 is a plan view of the flexible printed circuit 102 according to the first embodiment. Unlike FIG. 4A, FIG. 6 illustrates the first protective layer 150A. Unlike FIG. 4A, the flexible printed circuit 102 illustrated in FIG. 6 is in a state of being disposed with respect to the stem 104.

A protective layer will be described below. In general, the protective layer is formed in such a manner that a sheet made of a resin material such as polyimide is coated onto a substrate, on which a wiring pattern is deposited, using a thermosetting adhesive and is bonded thereto with heat and load. Considering the deviation of the bonding, if the protective layer is superimposed on even a part of the land pattern which normally has only a very small region, the connection region by the solder becomes narrow. Therefore, when the land pattern has a circular shape, an opening diameter larger than the outer diameter of the land pattern is generally formed in the protective layer.

In contrast, the first protective layer 150A according to the first embodiment is disposed on the first surface of the flexible printed circuit 102, covers the signal strip conductor member 143, and covers at least a part of the outer edge of the signal land 144. Since the outer diameter of the signal land 144 is larger than the inner diameter of the first through hole 113, even if the first protective layer 150A overlaps with a part of the signal land 144, it is possible to secure a region where the solder 161 is disposed. For this reason, for the purpose of preventing land-peeling due to a thermal load, the first protective layer 150A is preferably disposed so as to partially overlap with the signal land 144. That is, the first protective layer 150A is disposed out of the signal land 144 so as to avoid the region, where the solder 161 is disposed in order to physically connect with the signal lead terminal 111. Even when an excessive thermal load is applied by the pressure of the first protective layer 150A, the peeling of the signal land 144 from the substrate 160 can be prevented.

As illustrated in FIG. 5, the second protective layer 150B is disposed on the second surface of the flexible printed circuit 102. The second protective layer 150B covers the ground conductor layer 146. In addition, at the place where the flexible printed circuit 102 and the stem 104 (eyelet 121) are connected to each other, the second protective layer 150B covers a portion excluding a partial region including the pair of second through holes 141 and the ground through hole 142. Further, the second protective layer 150B is not formed in the circular region including the ground through hole 142. The diameter of the circular region including the ground through hole 142 may be about the same as the diameter of the circular region including the second through hole 141.

Figure 9:
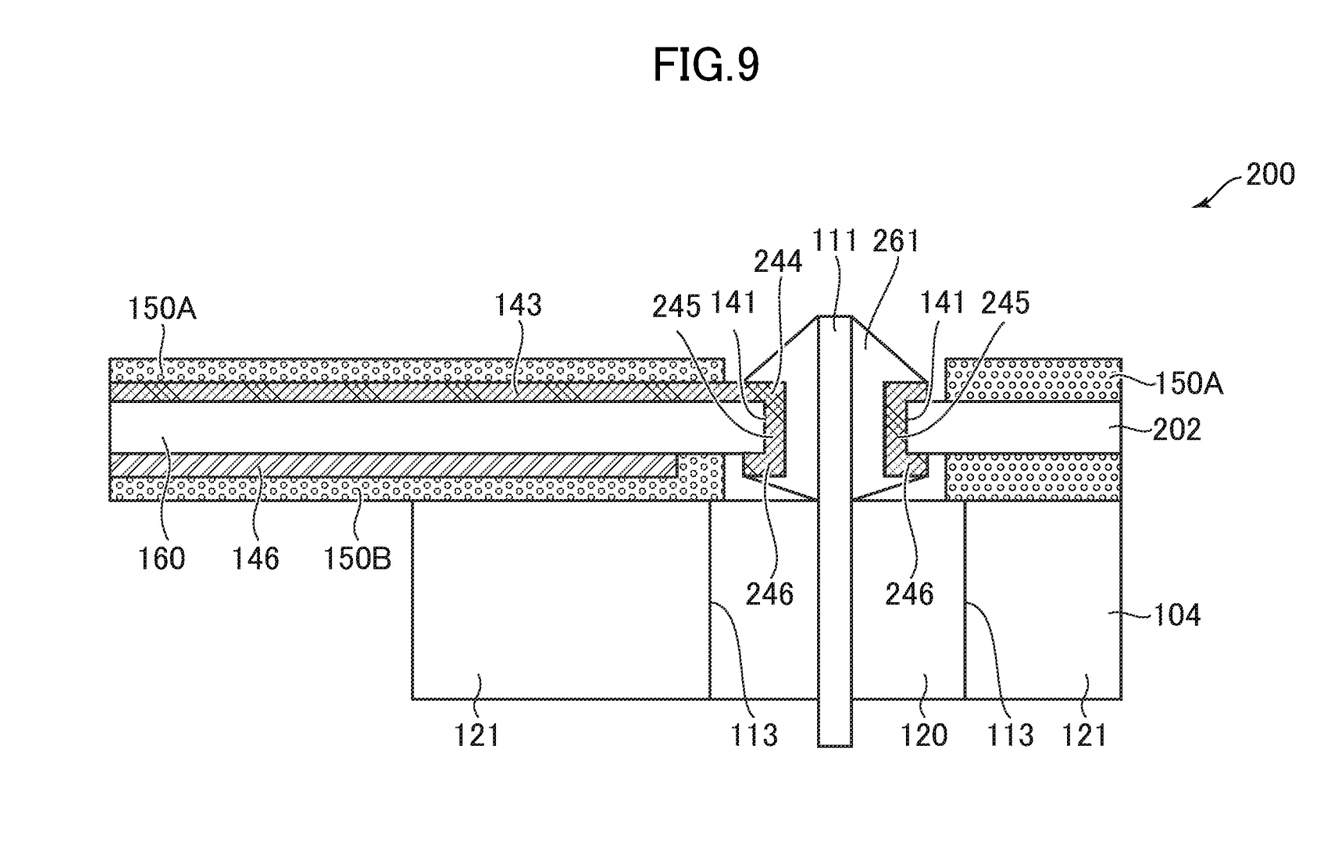
FIG. 9 is a cross-sectional view illustrating a structure of a part of an optical module according to a comparative example of the present invention.

FIG. 9 is a cross-sectional view illustrating a structure of a part of an optical module 200 according to a comparative example of the present invention, and corresponds to the cross section of a part of the optical module 2 according to the first embodiment illustrated in FIG. 5. The optical module 200 according to the comparative example includes an optical subassembly 101 and a flexible printed circuit 202. In the optical subassembly 101, structures of a stem 104 and a pair of signal lead terminals 111 are the same as those in the first embodiment. The flexible printed circuit 202 according to the comparative example has a structure different from that of the flexible printed circuit 102 according to the first embodiment. In the flexible printed circuit 102 according to the example, only the pair of signal lands 144 are connected to one ends of the pair of signal strip conductor members 143. On the other hand, in the flexible printed circuit 202 according to the comparative example, one ends of a pair of signal strip conductor members 143 connect with not only a pair of first signal lands 244 disposed on a first surface of a substrate 160 but also a conductor member 245 formed on an inner wall of a second through hole 141 and a pair of second signal lands 246 disposed on a second surface of the substrate 160. The conductor member 245 is formed by copper plating or the like, for example.

The flexible printed circuit 202 according to the comparative example includes not only the first signal land 244 but also the second signal land 246. A solder 261 physically connects the first signal land 244 and the signal lead terminal 111, but this is exemplified. The solder 261 enters between the signal lead terminal 111 and the second through hole 141, and physically connects the conductor member 245 and the signal lead terminal 111 to each other and the second signal land 246 and the signal lead terminal 111 to each other. By such connection, the signal strip conductor member 143 and the signal lead terminal 111 are electrically connected to each other. The second signal land 246 is at a short distance from an eyelet 121 serving as a ground potential (GND), resulting in increasing the capacitance. For this reason, when each of the first signal land 244 and the second signal land 246 has a circular shape, it is not possible to obtain desired impedance characteristics unless the outer diameters thereof are made as small as possible. From the viewpoint of reducing the capacitance, it is conceivable to move the second signal land 246 away from the eyelet 121. In this case, a gap is formed between the eyelet 121 and the flexible printed circuit 202, the inductance is increased by the signal lead terminal 111 of the portion (the portion between the eyelet 121 and the flexible printed circuit 202), and the characteristic impedance will be increased. Therefore, it is desirable to further reduce the distance between the eyelet 121 and the flexible printed circuit 202 and further reduce the outer diameters of the first signal land 244 and the second signal land 246. From eccentricity of the signal lead terminal 111 due to manufacturing variation and workability at the time of soldering, however, the solder 261 enters between the signal lead terminal 111 and the second through hole 141 and wraps around the second surface of the flexible printed circuit 202. Although the connection reliability between the signal lead terminal 111 and the signal strip conductor member 143 is increased by the wrapping of the solder 261 up to the second surface of the flexible printed circuit 202, the electric connection and the short circuit between the signal lead terminal 111 and a ground conductor layer 146 or the eyelet 121 may be increased by excessive supply of the solder 261.

In order to reduce the possibility of short circuiting in the flexible printed circuit 202 according to the comparative example, it is necessary to prevent the short circuit due to a physical barrier by covering the signal lead terminal 111 with a dielectric or inserting a spacer between the flexible printed circuit 202 and the eyelet 121. In the flexible printed circuit 102 according to the first embodiment, however, such a way is not required, and working hours and the number of parts can be reduced.

In the flexible printed circuit 202 according to the comparative example, although characteristic impedance matching can be achieved at a low transmission rate, characteristic impedance matching becomes difficult at a high transmission rate such as 25 Gbit/s. In order to achieve the characteristic impedance matching at a high transmission rate, the inductance and the capacitance should be reduced. In the flexible printed circuit 202 according to the comparative example, however, the reduction of the capacitance is limited due to the existence of the second signal land 246. On the other hand, since the land patterns are not formed on the second surface in the flexible printed circuit 102 according to the first embodiment, the capacitance parasitic to the land patterns can be reduced. Using various techniques for reducing the inductance, the inductance and the capacitance can be reduced together, and the characteristic impedance matching can be achieved even at a high transmission rate.

The land patterns may peel off from the substrate 160 due to the thermal load at the time of solder supply. In the flexible printed circuit 202 according to the comparative example, the conductor member 245 is formed on the inner wall of the second through hole 141, the second signal land 246 is formed on the second surface, whereby the peeling of the land pattern from the substrate 160 is prevented. On the other hand, in the flexible printed circuit 101 according to the embodiment, a wider region is secured for the signal land 144, whereby the peeling of the land pattern from the substrate 160 is prevented. In addition, since the protective layer 150 is formed so as to overlap with the outer edge (at least a part) as well as the connection portion with the signal strip conductor member 143 of the signal land 144, the physical connection with the substrate 160 is strengthened.

Second Embodiment

Figure 7:
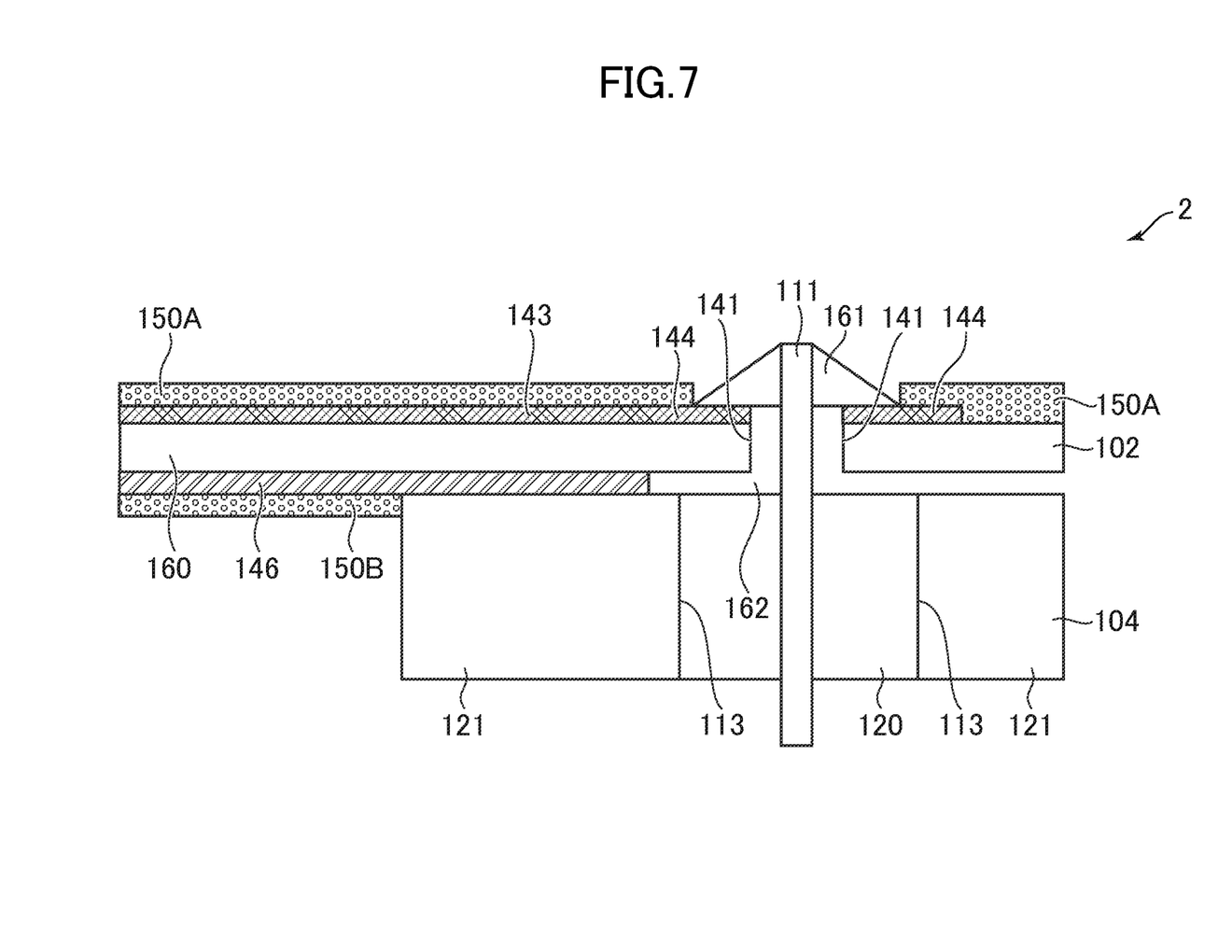
FIG. 7 is a plan view of a flexible printed circuit according to a second embodiment of the present invention.

FIG. 7 is a cross-sectional view illustrating a structure of a part of an optical module 2 according to a second embodiment of the present invention, and corresponds to the cross-sectional view of a part of the optical module 2 illustrated in FIG. 5 according to the first embodiment. The second embodiment has the same structure as the first embodiment except that a flexible printed circuit 102 has a different structure. Specifically, a second protective layer 150B disposed on a second surface of the flexible printed circuit 102 according to the second embodiment has a different shape from the second protective layer 150B according to the first embodiment.

As illustrated in FIG. 7, the second protective layer 150B is not formed in a region where the second surface of the flexible printed circuit 102 faces an outer surface of a stem 104 (eyelet 121). That is, the second protective layer 150B is disposed on the second surface, covers a ground conductor layer 146, and is disposed so as to avoid a region where the flexible printed circuit 102 and the stem 104 overlap with each other in a plan view. Since the second protective layer 150B is not formed in such a region, the distance between a main body (substrate 160) of the flexible printed circuit 102 and the stem 104 (eyelet 121) is further shortened, and the inductance parasitic on a signal lead terminal 111 is reduced.

Third Embodiment

Figure 8:
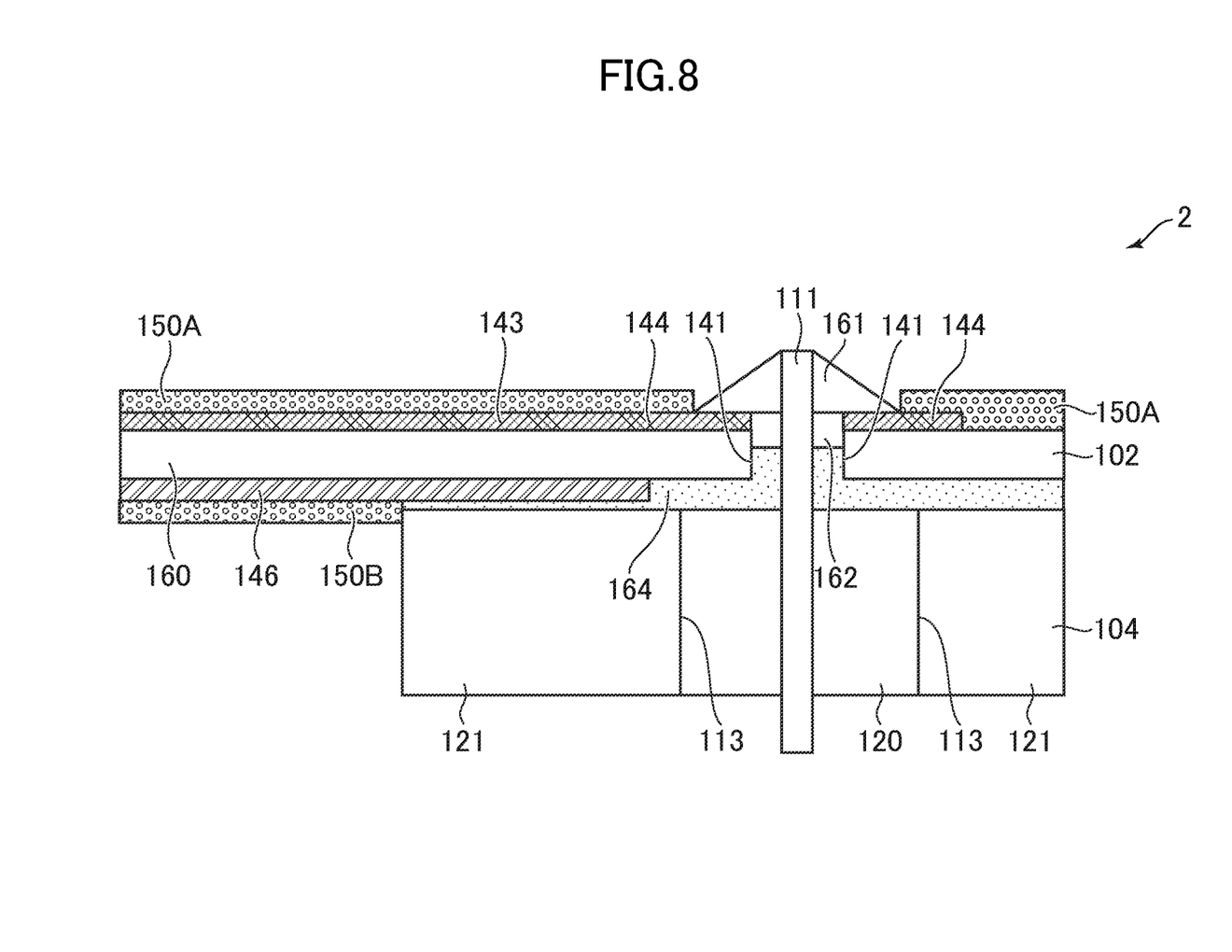
FIG. 8 is a plan view of a flexible printed circuit according to a third embodiment of the present invention.

FIG. 8 is a cross-sectional view illustrating a structure of a part of an optical module 2 according to a third embodiment of the present invention, and corresponds to the cross-sectional view of a part of the optical module 2 illustrated in FIG. 7 according to the second embodiment. The third embodiment has the same structure as the second embodiment except that a flexible printed circuit 102 has a different structure. Specifically, a dielectric 164 is disposed in at least a part between a signal lead terminal 111 and a second through hole 141. Since a side surface (at least a part) of the signal lead terminal 111 is surrounded by the dielectric 164, the inductance parasitic on the signal lead terminal 111 can be further reduced.

The dielectric 164 is preferably a material having flexibility higher than that of a second protective layer 150B when the flexible printed circuit 102 is disposed with respect to a stem 104 (when the flexible printed circuit 102 is mounted on the stem 104). The dielectric 164 preferably has flexibility enough to fill irregularities of the inner wall of the second through hole 141 when the flexible printed circuit 102 is mounted. Voids, which can be formed on the outer surface of the stem 104 and the inner wall of the second through hole 141, can be filled with the dielectric 164, the inductance parasitic on the signal lead terminal 111 can be further reduced, and manufacturing variations can be prevented. The second protective layer 150B according to the third embodiment has the same shape as the second protective layer 150B according to the second embodiment, but is not limited thereto. The second protective layer 150B according to the third embodiment may have the same shape or a different shape relative to the second protective layer 150B according to the first embodiment.

The optical module, the optical transmission equipment, and the optical transmission system according to the embodiments of the present invention are described above. The present invention is not limited to the embodiments, and various modifications can be widely applied. The configuration described in the embodiments can be replaced with substantially the same configuration, a configuration that achieves the same operational effect, or a configuration that can achieve the same object. In the embodiments, the eyelet 121 is a metal disc, but there is no essential significance of having a disc shape. The eyelet does not need to have a perfect disc shape, and a part thereof may be missing or protruding. The eyelet may have another shape such as a rectangle. Further, the conductor plate may be made of another good conductor without being limited to metal. According to the embodiments, the optical subassembly 101 has a TO-CAN package type, but may have a box type. In this case, the wiring circuit board is a field through which is realized by a dielectric plate.

One of optical semiconductor device 124 included in the optical assembly 101 according to the embodiments is a semiconductor laser element which is a light-emitting element, and the optical subassembly 101 is TOSA, but is not limited thereto. The optical subassembly may include a plurality of optical semiconductor devices. The optical subassembly may be ROSA (Receiver Optical Subassembly), and the optical semiconductor device included in the optical subassembly may be a light-receiving element such as a photo diode. In addition, the optical subassembly may be BOSA (Bidirectional Optical Subassembly).

In the embodiments, the pair of signal lead terminals 111 are used, but other signal lead terminals may be used without being limited thereto. For example, one lead terminal for single-ended transmission may be used. In the embodiments, the stem 104 includes two first through holes 113 and the pair of signal lead terminals 111 are respectively disposed, but another signal lead terminal may be further provided without being limited thereto. One ground lead terminal 112 is brazed to the stem 104, but another ground lead terminal may be provided without being limited thereto.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An optical module comprising:
   a conductor plate including a first through hole that penetrates from an inner surface to an outer surface;
   a signal lead terminal that penetrates the first through hole from the inner surface to the outer surface and protrudes from the outer surface,
      the signal lead terminal being fixed to the first through hole by a first dielectric; and
   a wiring circuit board comprising:
      a first surface,
      a second surface that faces the outer surface,
      a signal strip conductor member disposed on the first surface,
      a signal land disposed on the first surface,
         the signal land being in contact with the signal strip conductor member, and
         the signal lead terminal being electrically connected to the signal strip conductor member through the signal land,
      a ground conductor layer disposed on the second surface, and
      a second through hole,
         the signal lead terminal penetrating the second through hole from the second surface to the first surface and protruding from the first surface,
         the second through hole being surround by the signal land, and
         a second dielectric being at least partially disposed between the signal lead terminal and a wall of the second through hole,
            the second dielectric being different from the first dielectric.

2. The optical module of claim 1, wherein the wiring circuit board further comprises:
   an air layer at least partially between the signal lead terminal and the wall of the second through hole.

3. The optical module of claim 1, wherein the wiring circuit board further comprises:
   a protective layer that is disposed on the signal strip conductor member and at least on an outer edge of the signal land.

4. The optical module of claim 1, wherein the wiring circuit board further comprises:
   a protective layer that is disposed on the ground conductor layer and not between the wiring circuit board and the conductor plate.

5. The optical module of claim 4, wherein the second dielectric is a material having higher flexibility than the protective layer.

6. The optical module of claim 1, wherein the wall of the second through hole is separated from the signal lead terminal.

7. The optical module of claim 1, wherein the conductor plate has a maximum width of 6 mm or less,
   wherein the signal lead terminal has a maximum width of 0.22 mm or more and 0.35 mm or less,
   wherein the first through hole has a maximum width of 0.4 mm or more and 0.85 mm or less, and
   wherein the signal land has a maximum width of 0.9 mm or more in a portion other than a connection portion with the signal strip conductor member.

8. An optical transmission equipment on which the optical module of claim 1 is mounted.

9. The optical module of claim 1, wherein the second dielectric comprises an air layer.

10. A circuit board, comprising:
    a substrate having a first surface and a second surface;
    a signal strip conductor member disposed on the first surface;
    a signal land disposed on the first surface;
       the signal land being in contact with the signal strip conductor member, and
       a signal lead terminal being electrically connected to the signal strip conductor member through the signal land,
    a ground conductor layer disposed on the second surface; and
    a through hole,
       the signal lead terminal penetrating the through hole from the second surface to the first surface and protruding from the first surface,
       the through hole being surround by the signal land, and
       a dielectric being at least partially disposed between the signal lead terminal and a wall of the through hole.

11. The circuit board of claim 10, further comprising:
    an air layer at least partially between the signal lead terminal and the wall of the through hole.

12. The circuit board of claim 10, further comprising:
    a protective layer that is disposed on the signal strip conductor member and at least partially on the signal land.

13. The circuit board of claim 12, wherein the protective layer is a first layer; and
    wherein the circuit board further comprises:
       a second protective layer that is disposed on at least a portion of the ground conductor layer.

14. The circuit board of claim 13, wherein the second protective layer is at least partially disposed between the ground conductor layer and a conductor plate.

15. The circuit board of claim 13, wherein the second protective layer is at least partially disposed on the second surface of the substrate.

16. The circuit board of claim 10, wherein a portion of the ground conductor layer is physically connected to a portion of a conductor plate.

17. The circuit board of claim 16, wherein a portion of the dielectric is physically connected to another portion of the conductor plate.

18. The circuit board of claim 10, wherein the dielectric is at least partially disposed between the circuit board and a conductor plate.

19. The circuit board of claim 10, wherein the dielectric comprises an air layer.

20. The circuit board of claim 10, wherein the dielectric is at least partially disposed between the ground conductor layer and a conductor plate.

* * * * *